US010141670B1

(12) United States Patent
Stevenot

(10) Patent No.: US 10,141,670 B1
(45) Date of Patent: Nov. 27, 2018

(54) SUBSTRATE CONNECTOR INCLUDING A SPRING PIN ASSEMBLY FOR ELECTROSTATIC CHUCKS

(71) Applicant: Lam Research Corporation, Fremont, CA (US)

(72) Inventor: Scott Stevenot, Pleasanton, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/681,556

(22) Filed: Aug. 21, 2017

(51) Int. Cl.
*H01R 13/24* (2006.01)
*H01L 21/683* (2006.01)
*H01R 13/17* (2006.01)

(52) U.S. Cl.
CPC ....... *H01R 13/2421* (2013.01); *H01L 21/683* (2013.01); *H01L 21/6833* (2013.01); *H01R 13/17* (2013.01)

(58) Field of Classification Search
CPC .................................................. H01R 13/2421
USPC ....... 439/700, 862, 823, 482, 824, 331, 332, 439/70, 840
See application file for complete search history.

(56) References Cited

U.S. PATENT DOCUMENTS 5,877,554 A * 3/1999 Murphy ............... G01R 1/0483 257/727
6,020,635 A * 2/2000 Murphy ............. H01R 13/2421 257/727
6,758,682 B1 * 7/2004 Kosmala ............ H01R 13/2421 439/66
6,861,862 B1 * 3/2005 Tate ..................... G01R 1/0466 324/756.02
7,114,996 B2 * 10/2006 Goodman .......... H01R 13/2421 439/700
7,220,134 B2 * 5/2007 Goodman .......... H01R 13/2421 439/70
7,256,593 B2 * 8/2007 Treibergs ........... G01R 1/06722 324/754.05
7,351,121 B2 * 4/2008 Xu ..................... H01R 13/2421 439/66
7,362,114 B2 * 4/2008 Winter ................. G01R 1/0441 324/756.02
7,435,102 B2 * 10/2008 Goodman .......... H01R 13/2421 361/813
7,467,952 B2 * 12/2008 Hsiao ................. H01R 13/2421 439/66
7,690,925 B2 * 4/2010 Goodman ............ H05K 7/1061 361/813
7,815,438 B2 * 10/2010 Kazama ............. G01R 1/06722 439/66
7,946,855 B2 * 5/2011 Osato ................... H05K 7/1069 324/755.05
8,591,270 B1 * 11/2013 Ramsey ................. H01R 13/24 439/700

(Continued)

*Primary Examiner* — Tulsidas C Patel
*Assistant Examiner* — Peter G Leigh

(57) ABSTRACT

A substrate connector to provide a connection to a substrate during substrate processing includes a spring pin assembly defining a first contact and including a first groove. A retention spring clip includes a body arranged in the first groove and projections extending from the body. A second contact includes a body defining a second groove. The second contact is arranged around the first contact of the spring pin assembly. The projections of the retention spring clip extend into the second groove in the second contact.

14 Claims, 7 Drawing Sheets

(56) References Cited

U.S. PATENT DOCUMENTS

| | | | | |
|---|---|---|---|---|
| 8,690,583 | B2 * | 4/2014 | Uesaka | H01R 12/714 439/63 |
| 8,708,747 | B2 * | 4/2014 | Leroyer | H01R 13/2421 439/625 |
| 9,559,452 | B1 * | 1/2017 | Mugan | H01R 13/422 |
| 2004/0043641 | A1 * | 3/2004 | Kosmala | H01R 23/688 439/66 |
| 2006/0172613 | A1 * | 8/2006 | Sasaki | H01R 13/2421 439/824 |
| 2006/0279301 | A1 * | 12/2006 | Treibergs | G01R 1/06722 324/754.05 |
| 2010/0068947 | A1 * | 3/2010 | Hsiao | G01R 1/06722 439/786 |
| 2011/0104959 | A1 * | 5/2011 | Asai | H01R 13/2421 439/823 |
| 2011/0171839 | A1 * | 7/2011 | Yang | H01R 12/714 439/66 |
| 2012/0238136 | A1 * | 9/2012 | Hwang | G01R 1/06722 439/607.01 |
| 2016/0315407 | A1 * | 10/2016 | Schrameyer | H05B 3/06 |

* cited by examiner 100
105
106
104
134
108
138
120
121
122
126
124
122
136
126
124
110
108
138
134
112

155
154
156
120
122
126
156
150
157
124
158
163
153
160

162
159
168
182
166
184
172
174
152
180
180
178

SUBSTRATE CONNECTOR INCLUDING A SPRING PIN ASSEMBLY FOR ELECTROSTATIC CHUCKS

FIELD

The present disclosure relates to substrate processing systems, and more particularly to a substrate connector including a spring pin assembly for electrostatic chucks used in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During processing of substrates such as semiconductor wafers, various processes including deposition, etching and/or other substrate treatments are performed. Substrate processing systems for performing etching typically include a processing chamber with a substrate support such as an electrostatic chuck. A substrate such as a semiconductor wafer may be arranged on the substrate support. A process gas mixture including one or more etching gases and/or carrier gases may be introduced into the processing chamber to etch film on the substrate. Plasma may be struck in the processing chamber to activate chemical reactions.

In some applications, it is desirable to control a bias on the substrate during processing. Spring pins or other connection approaches have been used to apply ground, a DC bias or an AC bias to a backside of the substrate. However, due to mismatch in coefficients of thermal expansion (CTE) between the substrate and components of the ESC, the substrate may move laterally relative to ESC during processing.

Referring now to FIGS. 1-2, examples for providing a connection to a substrate are shown. In FIG. 1, a substrate 14 is arranged on a substrate support 10 such as an ESC. The substrate support 10 includes an upper layer 16 (such as a bond) and a metal housing 20. A connector 22 passes through the metal housing 20 and is connected to a spring pin 24. An upper end of the spring pin 24 is biased against a bottom surface of the substrate 14. The spring pin 24 remains in a fixed lateral position during substrate processing. However, the substrate 14 moves laterally due to CTE thermal mismatch between the substrate and components of the substrate support 10. The lateral movement causes rubbing along the bottom surface of the substrate 14, which wears the spring pin 24 and damages the substrate 14.

In FIG. 2, a contact 30 is soldered to a bottom surface of the substrate 14. A conductor 32 is soldered to the contact 30 and attached to the connector 22. While the conductor 32 allows movement of the contact 30 with the substrate 14 during processing, the conductor 32 and the contact 30 are typically made of different materials and experience CTE mismatch. Over time, a solder joint between the conductor 32 and the contact 30 experiences fatigue due to the CTE mismatch between the conductor 32 and the contact 30 and eventually fails.

SUMMARY

A substrate connector provides a connection to a substrate during substrate processing and includes a spring pin assembly defining a first contact and including a first groove. A retention spring clip includes a body arranged in the first groove and projections extending from the body. A second contact includes a body defining a second groove. The second contact is arranged around the first contact of the spring pin assembly. The projections of the retention spring clip extend into the second groove in the second contact.

In other features, the second contact is soldered to the substrate. The substrate connector is arranged between the substrate and a substrate support. The substrate support includes an electrostatic chuck. The body of the retention spring clip has a "C"-shaped cross-section.

In other features, the retention spring clip allows relative movement between the spring pin assembly and the second contact. The second contact includes a plurality of spacers located on a top surface thereof. The spring pin assembly further includes a first portion defining a cavity, a first opening and a second opening. The first contact is arranged in the cavity, extends from the first opening and includes an arcuate contact, a cylindrical body, and a base portion. A second portion is removably received in the second opening.

In other features, the spring pin assembly further includes a ball contacting an inclined surface of the base portion and a spring arranged between the second portion and the ball. The second portion defines a cavity. A conductor includes an end that is arranged in the cavity and soldered to the second portion.

In other features, the second portion and the conductor are made of the same type of material. A conductor is soldered to the spring pin assembly.

A system includes the substrate, an electrostatic chuck, and the substrate connector. The substrate connector is soldered to a bottom surface of the substrate and is arranged between the substrate and the electrostatic chuck. An AC signal source is connected to the conductor.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
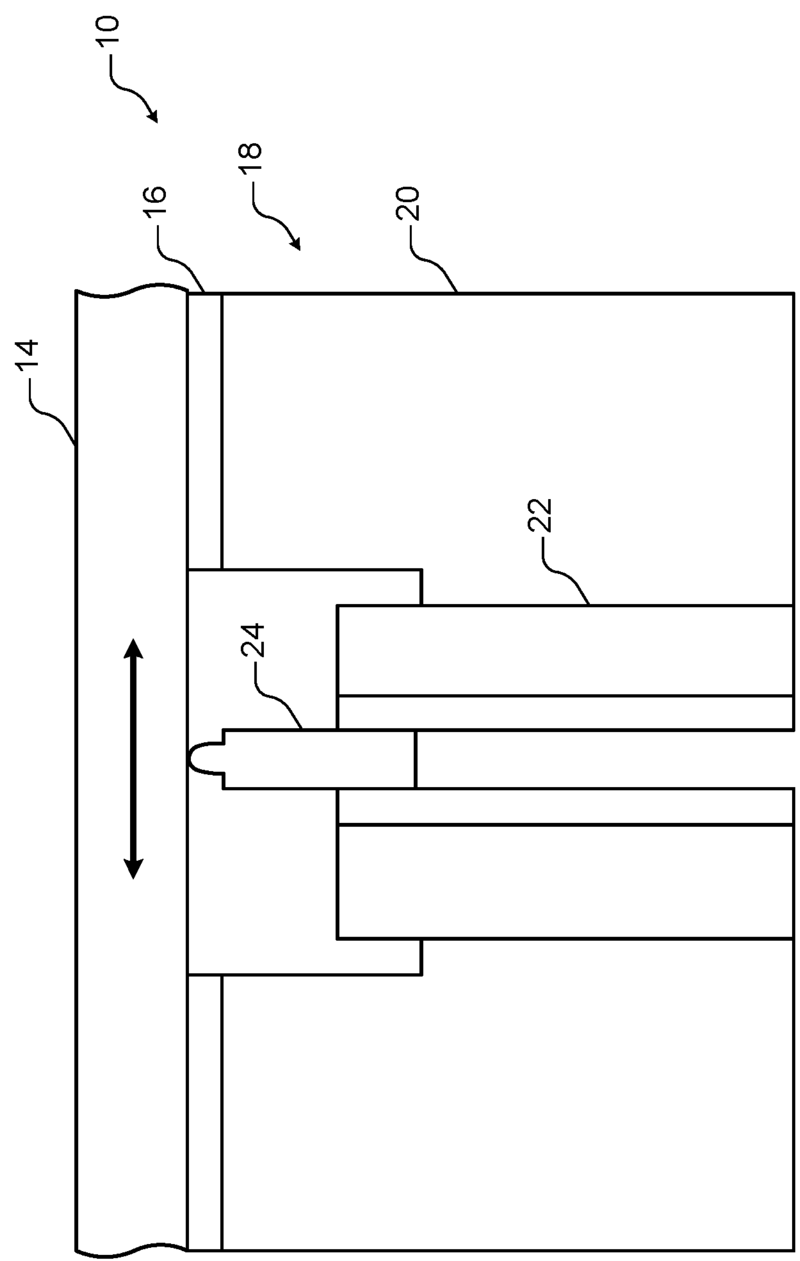
FIG. 1 is a side cross-sectional view of an example of a spring pin according to the prior art.
Figure 2:
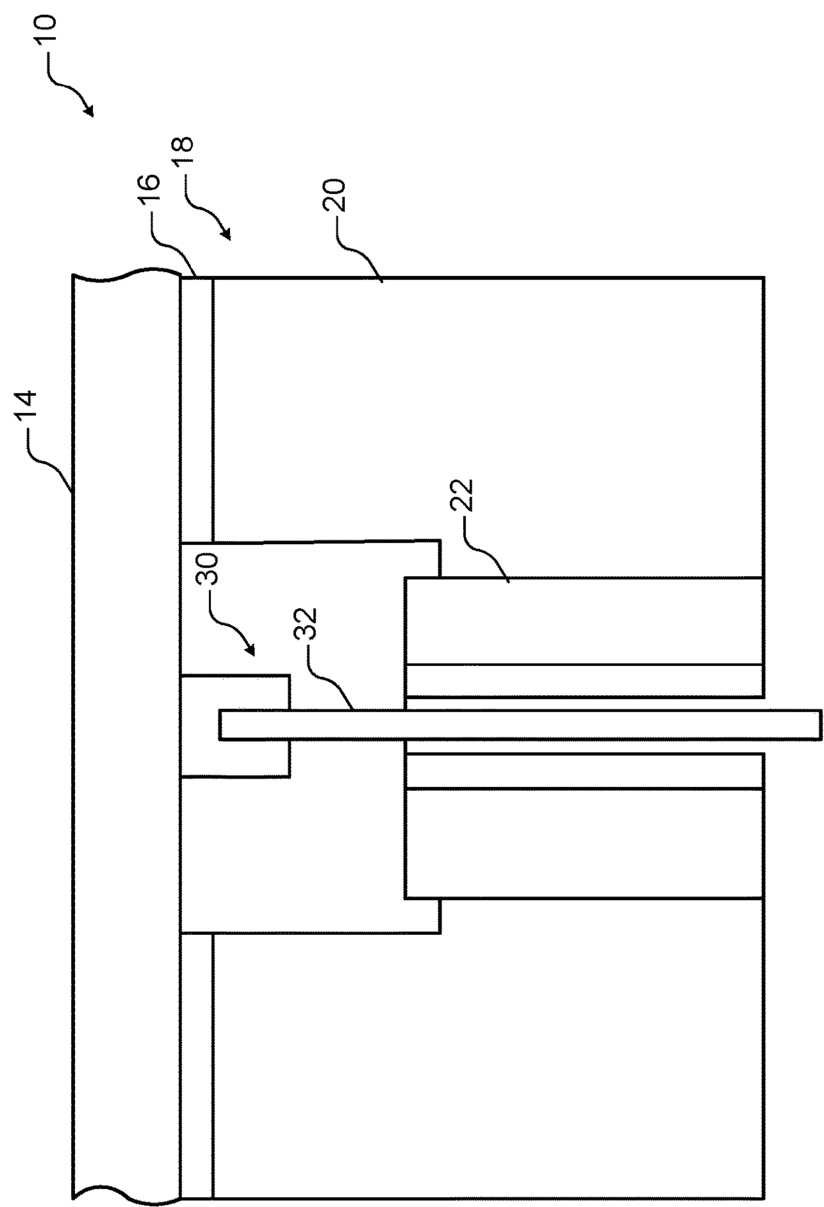
FIG. 2 is a side cross-sectional view of an example of another substrate connection according to the prior art.

A substrate connector according to the present disclosure is used to provide a connection to a substrate to allow a DC bias, an AC bias or ground potential to be supplied to the substrate during substrate processing such as deposition, etching or other substrate treatment. The substrate connector includes a spring pin assembly, a retention spring clip and a contact. The contact is arranged between the spring pin assembly and the substrate. The contact is soldered to the substrate and moves with the substrate. The retention spring clip mechanically constrains the spring pin assembly relative to the contact while allowing relative movement between the spring pin assembly and the contact. The substrate connector prevents damage to the substrate due to rubbing. The substrate connector also avoids CTE mismatch such as that shown above in the solder joint of FIG. 2.

Figure 3:
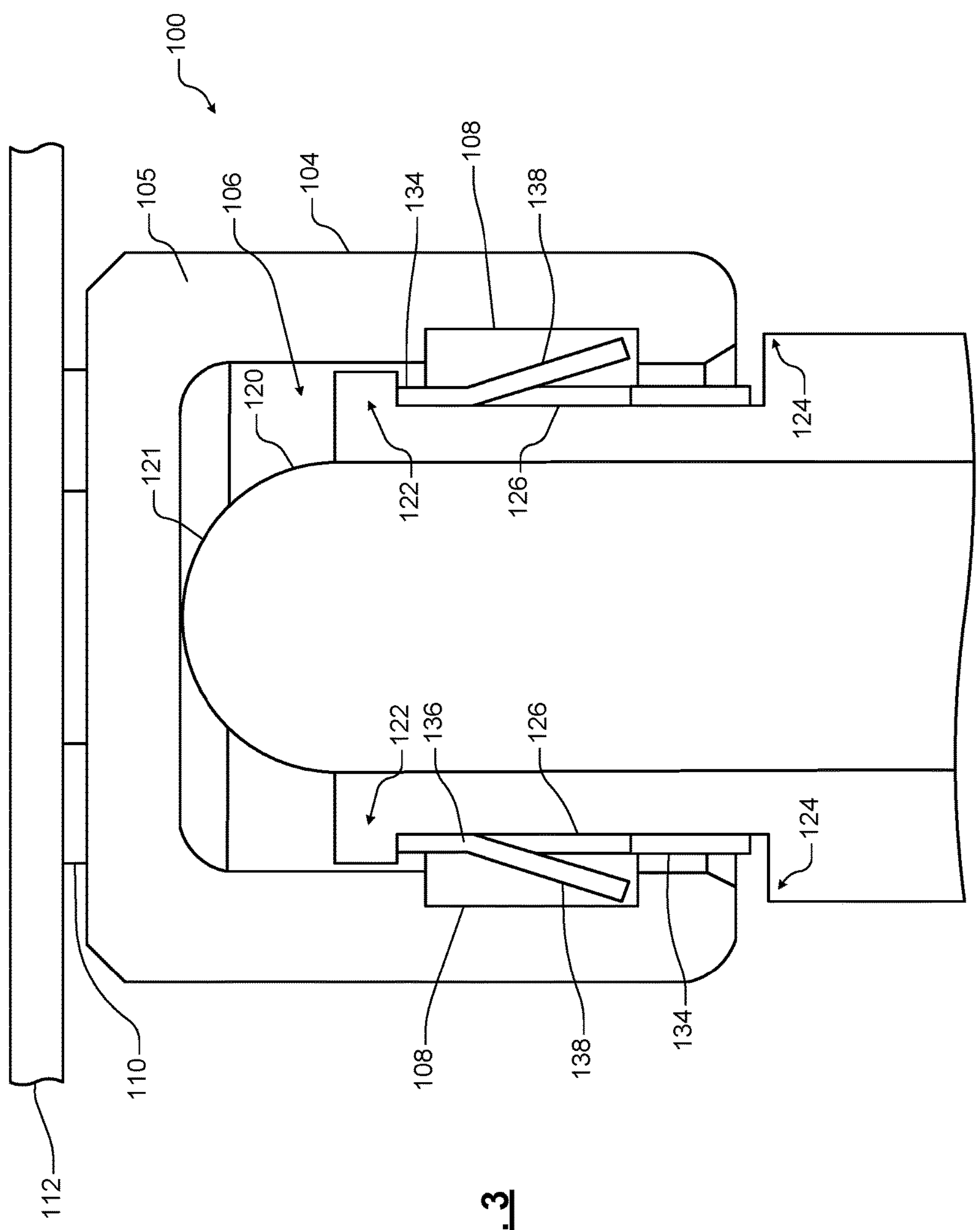
FIG. 3 is an enlarged side cross-sectional view of an example of a substrate connector according to the present disclosure.

Referring now to FIG. 3, a substrate connector 100 includes a contact 104 including a body 105 defining a cavity 106. In some examples, the body 105 is cylindrically shaped or rectangular shaped, although other shapes can be used. Opposing inner side walls of the contact 104 define a groove 108 having an annular shape. The groove 108 extends in an outward direction into the body 105 of the contact 104. Spacers 110 extend from a top outer surface of the contact 104 to provide uniform spacing relative to the substrate 112. In some examples, the contact 104 is made of copper (Cu) and tungsten (W), although other conducting materials can be used.

The substrate connector 100 further includes a spring pin assembly 120. The spring pin assembly 120 includes a contact surface 121 that is biased against an inner surface of the contact 104 as will be described further below. In some examples, the contact surface 122 has an arcuate or semi-circular cross-sectional shape, although other shapes can be used. The spring pin assembly 120 further defines upper and lower projections 122 and 124 that extend outwardly from the spring pin assembly 120. The upper and lower projections 122 and 124 are spaced apart. The upper and lower projections 122 and 124 can be in the shape of continuous annular rings or discontinuous projections can be used. An inwardly-directed groove 126 is located between the upper and lower projections 122 and 124.

The substrate connector 100 further includes a retention spring clip 134 including a body 136. The retention spring clip 134 further includes projections 138 that project outwardly from outer sides of the body 136 at an angle. In some examples, the angle is less than 45°. The body 136 of the retention spring clip 134 is arranged in the groove 126 defined on the spring pin assembly 120. The projections 138 extend into the groove 108 located on the contact 104. In some examples, the projections 138 have an outer diameter that is greater than an inner diameter of the opening into the contact 104 to provide locking or retention of the spring pin assembly 120 to the contact 104.

Figure 4:
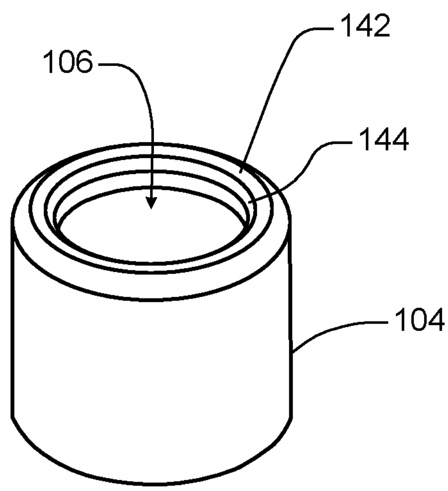
FIG. 4 is a perspective view of an example of a bottom surface of a contact of the substrate connector according to the present disclosure.
Figure 5:
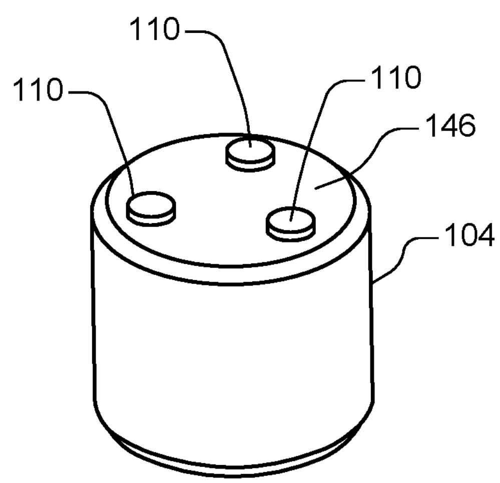
FIG. 5 is a perspective view of an example of a top surface of the contact of FIG. 4 according to the present disclosure.

Referring now to FIGS. 4-5, bottom and top surfaces of the contact 104 are shown, respectively. In FIG. 4, the contact 104 includes the cavity 106 that removably receives one end of the spring pin assembly 120 as shown in FIG. 3. A radially inner surface 142 of an opening 144 may be chamfered to improve ease of insertion. In FIG. 5, the spacers 110 extend from a top outer surface 146 and help to ensure proper spacing between the substrate and the contact 104. While three spacers 110 are shown, additional or fewer spacers can be used.

Figure 6:
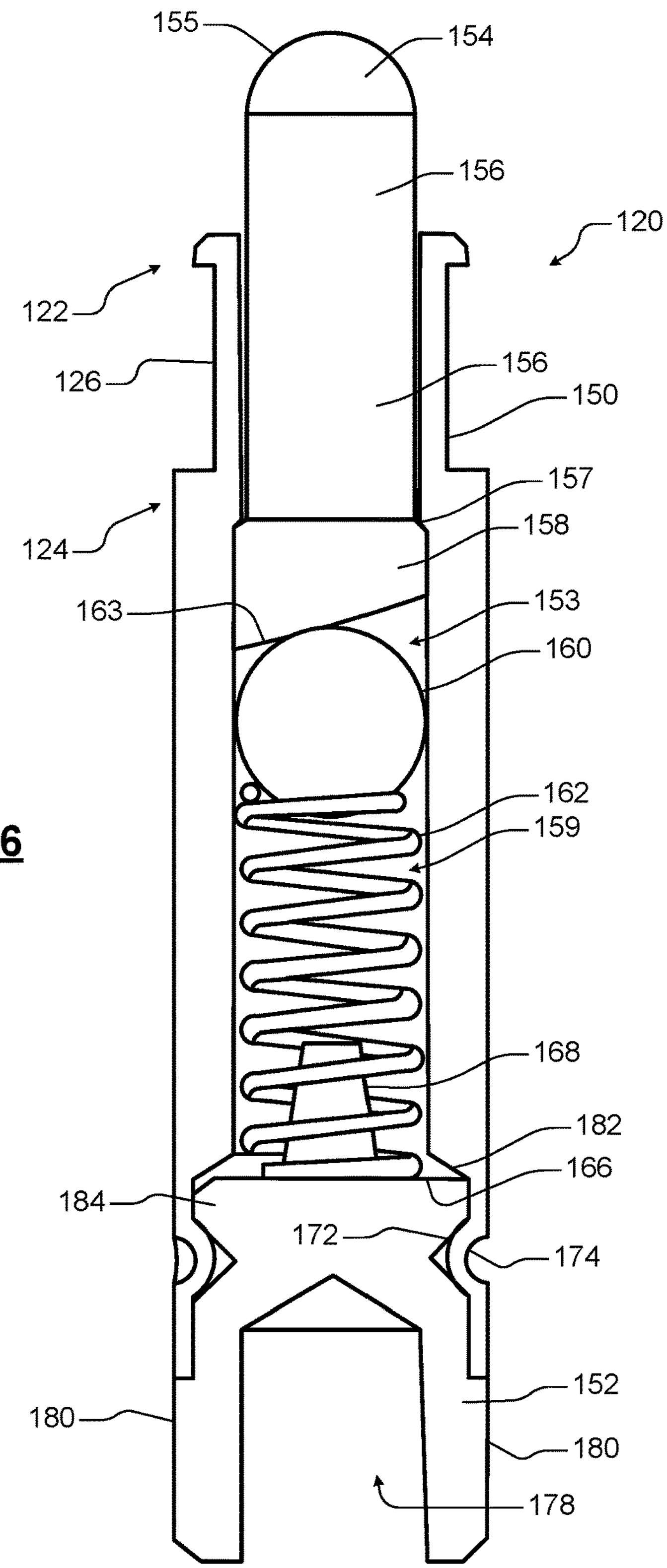
FIG. 6 is a side cross sectional view of a spring pin assembly of the substrate connector according to the present disclosure.

Referring now to FIG. 6, the spring pin assembly 120 includes a first portion 150 and a second portion 152. The first portion 150 is cylindrically shaped, includes first and second openings at opposite ends thereof and defines an inner cavity 153 between the first and second openings. A second portion 152 is removably inserted into the second opening of the inner cavity 153 of the first portion 150.

A contact 154 is reciprocally received in the inner cavity 153 of the first portion 150. The contact 154 includes an upper arcuate portion 155, a cylindrical portion 156 and a base portion 158. The contact 154 extends outwardly from the first opening of the inner cavity 153 of the first portion 150. In some examples, the inner cavity 153 of the first portion 150 defines a stop 157 that limits movement of the contact 154 in a first direction towards the substrate. In some examples, the stop 157 includes a corner or projection.

A contact biasing member 159 biases the base portion 158 of the contact 154 in the first direction. In some examples, the contact biasing member 159 includes a ball 160 and a spring 162. In some examples, the ball 160 contacts a surface 163 of the base portion 158 that is inclined at an acute angle relative to a force applied by the spring 162. The spring 162 is located between the ball 160 and the second portion 152. In some examples, the ball 160 and the spring 162 are made of a conducting material.

In some examples, the second portion 152 includes a projection 168 extending from an upper surface 166 thereof towards the contact 154 to guide one end of the spring 162. The second portion 152 may further include a groove 172 arranged around an outer portion thereof to receive projections 174 formed on an inner surface of the first portion 150. The groove 172 and the projections 174 removably connect the second portion 152 to the first portion 150. The second portion 152 further defines a cavity 178 located between sidewalls 180 thereof. The cavity 178 receives and is soldered to a conductor shown below in FIG. 8. In some examples, the second portion 152 and the conductor are made of the same material or materials having the same CTE or a similar CTE (e.g. within 5%, 2% or 1%). In some examples, both the second portion 152 and the conductor are made of copper (Cu), Cu alloy, aluminum (Al), Al alloy, or other conducting materials.

The first portion 150 further defines a groove 182 to receive an upper portion 184 of the second portion 152. The groove 182 limits movement of the second portion 152 in the first direction relative to the first portion 150.

Figure 7:
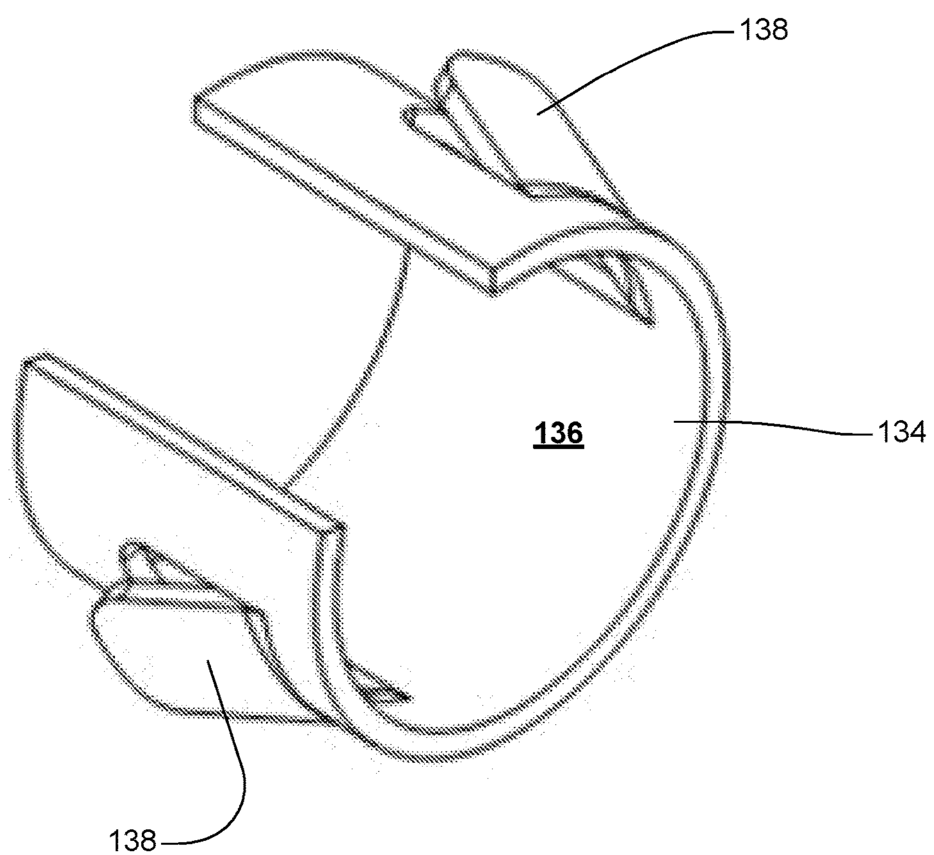
FIG. 7 is a perspective view of an example of a retention spring clip of the substrate connector according to the present disclosure.

Referring now to FIG. 7, the body 136 of the retention spring clip 134 is shown with a “C”-shaped cross section. One or more of the projections 138 are connected at one end to the body 136. Opposite ends project outwardly at an angle from the body 136. In some examples, the angle is less than 45°.

Figure 8:
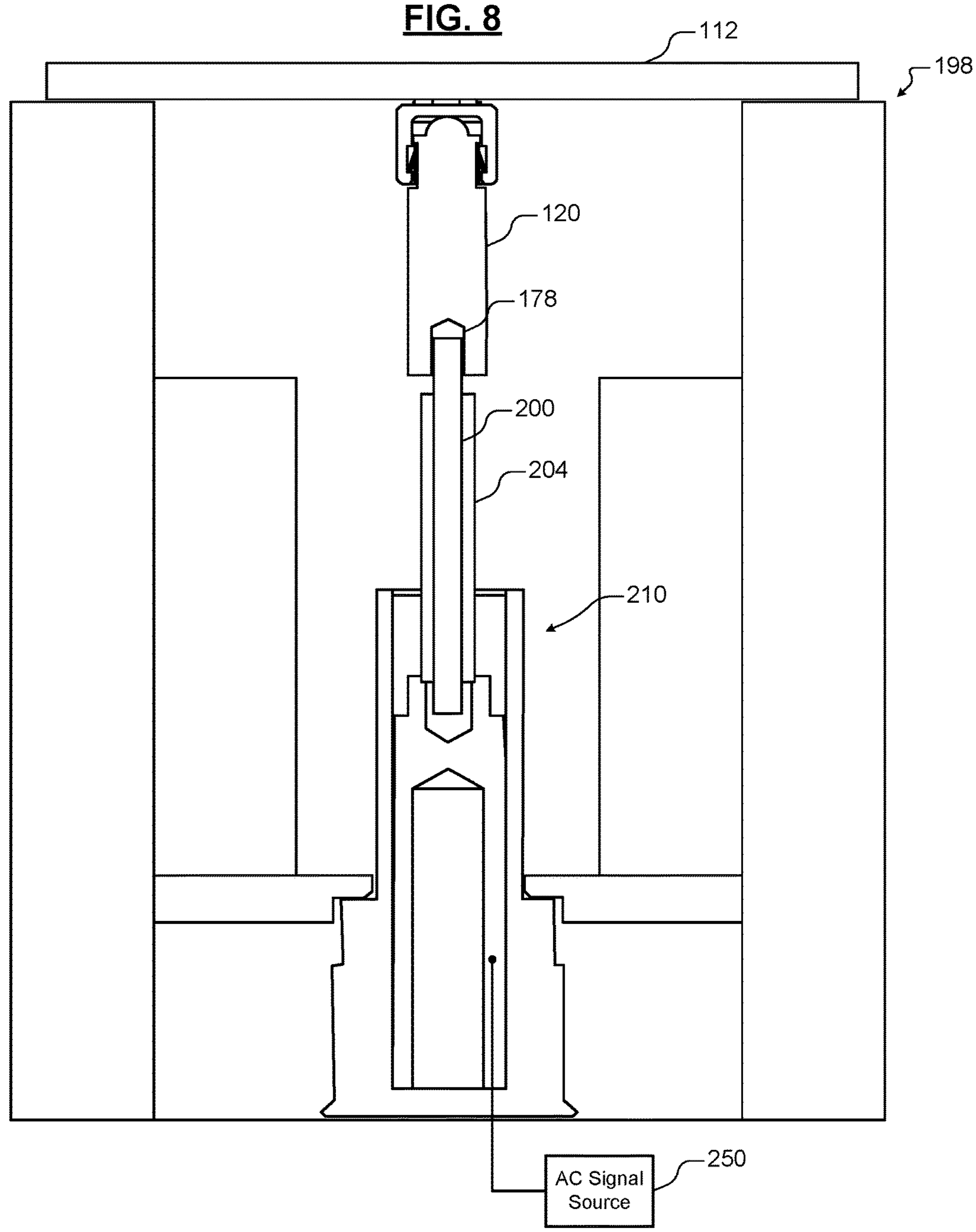
FIG. 8 is a side cross-sectional view of an example of the substrate connector arranged between the substrate and the substrate support according to the present disclosure.

Referring now to FIG. 8, the spring pin assembly 120 is arranged between the substrate 112 and the substrate support 198. One end of a conductor 200 including an insulating layer 204 is attached to the spring pin assembly 120. In some examples, the conductor 200 is soldered to the spring pin assembly 120. An opposite end of the conductor 200 is connected at 210. In some examples, the conductor 200 is connected to an AC signal source 250.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A substrate connector to provide a connection to a substrate during substrate processing, comprising:

a spring pin assembly defining a first contact and including a first groove, wherein the first groove extends inward relative to the first contact;

a retention spring clip including a body arranged in the first groove and projections extending from the body; and a second contact including a body defining a cavity, wherein the cavity defines a second groove in opposing inner side walls of the cavity and the second groove extends outward in a direction opposite the first groove, wherein the second contact is arranged around the first contact of the spring pin assembly, and wherein the projections of the retention spring clip extend outward from the first groove into the second groove in the second contact.

2. The substrate connector of claim 1, wherein the second contact is soldered to the substrate.

3. The substrate connector of claim 2, wherein the retention spring clip allows relative movement between the spring pin assembly and the second contact.

4. The substrate connector of claim 1, wherein the substrate connector is arranged between the substrate and a substrate support.

5. The substrate connector of claim 4, wherein the substrate support includes an electrostatic chuck.

6. The substrate connector of claim 1, wherein the body of the retention spring clip has a "C"-shaped cross-section.

7. The substrate connector of claim 1, further comprising a conductor that is soldered to the spring pin assembly.

8. A system comprising:

the substrate;

an electrostatic chuck; and the substrate connector of claim 7, wherein the substrate connector is soldered to a bottom surface of the substrate and is arranged between the substrate and the electrostatic chuck.

9. The system of claim 8, further comprising an AC signal source connected to the conductor.

10. A substrate connector to provide a connection to a substrate during substrate processing, comprising:

a spring pin assembly defining a first contact and including a first groove;

a retention spring clip including a body arranged in the first groove and projections extending from the body; and a second contact including a body defining a second groove, wherein the second contact is arranged around the first contact of the spring pin assembly, wherein the projections of the retention spring clip extend into the second groove in the second contact, and wherein the second contact includes a plurality of spacers located on a top surface thereof.

11. A substrate connector to provide a connection to a substrate during substrate processing, comprising:

a spring pin assembly defining a first contact and including a first groove;

a retention spring clip including a body arranged in the first groove and projections extending from the body; and a second contact including a body defining a second groove, wherein the second contact is arranged around the first contact of the spring pin assembly, and wherein the projections of the retention spring clip extend into the second groove in the second contact, wherein the spring pin assembly further includes:

a first portion defining a cavity, a first opening and a second opening, wherein the first contact is arranged in the cavity, extends from the first opening and includes:

an arcuate contact;

a cylindrical body; and a base portion; and a second portion removably received in the second opening.

12. The substrate connector of claim 11, wherein the spring pin assembly further includes:

a ball contacting an inclined surface of the base portion; and a spring arranged between the second portion and the ball.

13. The substrate connector of claim 11, wherein the second portion defines a cavity and further comprising a conductor including an end that is arranged in the cavity and soldered to the second portion.

14. The substrate connector of claim 13, wherein the second portion and the conductor are made of the same type of material.

* * * * *